(12) United States Patent
Ikeda

(10) Patent No.: US 7,689,956 B2
(45) Date of Patent: Mar. 30, 2010

(54) METHOD OF EVALUATING PESSIMISTIC ERROR IN STATISTICAL STATIC TIMING ANALYSIS

(75) Inventor: Hiroshi Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 50 days.

(21) Appl. No.: 11/679,496

(22) Filed: Feb. 27, 2007

(65) Prior Publication Data

US 2008/0010558 A1   Jan. 10, 2008

(30) Foreign Application Priority Data

Jul. 5, 2006   (JP) .............................. 2006-185515

(51) Int. Cl.
G06F 17/50 (2006.01)
G06F 9/45 (2006.01)
(52) U.S. Cl. .................. 716/6; 716/4; 716/5; 714/724; 714/789; 714/798; 714/799; 714/819
(58) Field of Classification Search ................ 716/4–6; 714/699, 700, 701, 724, 789, 798–799, 819
See application file for complete search history.

(56) References Cited

U.S. PATENT DOCUMENTS

| 5,365,463 | A | 11/1994 | Donath et al. | |
|---|---|---|---|---|
| 6,684,375 | B2 * | 1/2004 | Tsukiyama et al. | 716/6 |
| 7,320,118 | B2 * | 1/2008 | Homma et al. | 716/6 |
| 2005/0065765 | A1 | 3/2005 | Visweswariah | |
| 2005/0071788 | A1 * | 3/2005 | Bickford et al. | 716/4 |

FOREIGN PATENT DOCUMENTS

| JP | 07-13974 | 1/1995 |
|---|---|---|
| JP | 2005-92885 | 4/2005 |

OTHER PUBLICATIONS

Pan et al., Timing Yield Estimate Using Statistical static timing analysis, 2005, IEEE, pp. 2461-2464.*

* cited by examiner

*Primary Examiner*—Jack Chiang
*Assistant Examiner*—Nghia M Doan
(74) *Attorney, Agent, or Firm*—Fujitsu Patent Center

(57) ABSTRACT

First, a yield is calculated by employing conventional SSTA. Next, an independent LL set is determined, the independent LL set being a subset having sets of delay element sets that only include gates and nets not being shared by two or more paths. Next, a yield is calculated by employing SSTA while using only the independent LL set. Thereby, it is understood that the actual yield is between the yield obtained by employing the conventional SSTA and the yield obtained by employing the SSTA using only the independent LL set.

12 Claims, 8 Drawing Sheets

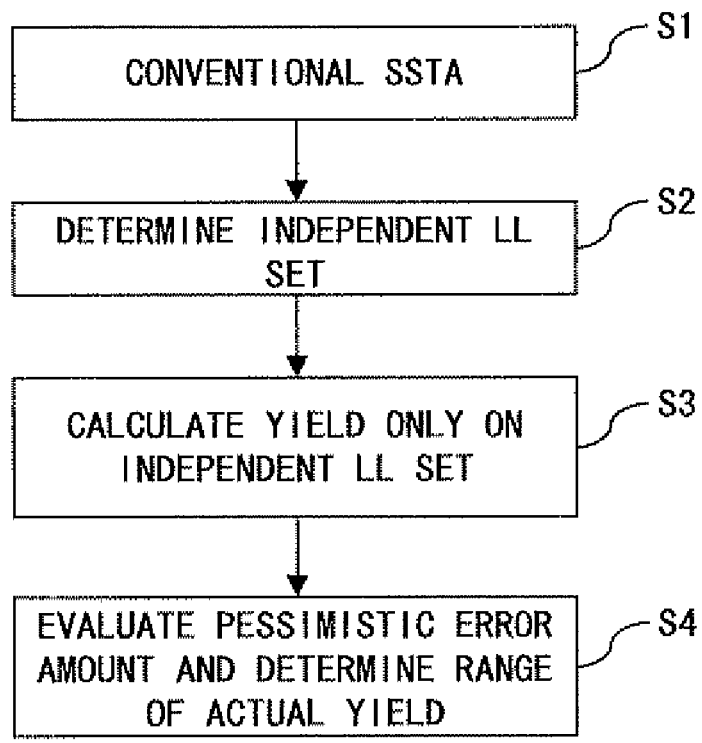
F I G. 2

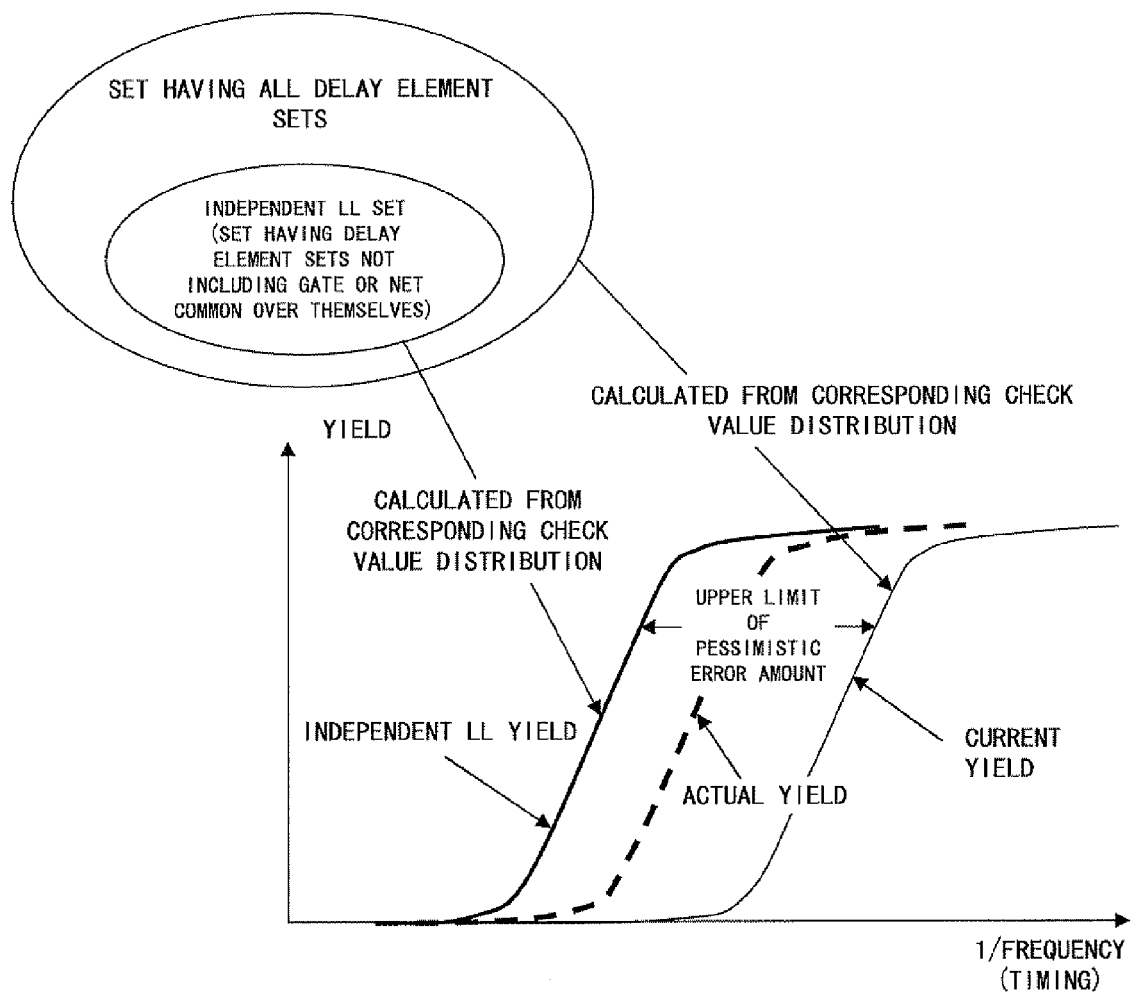
F I G. 5

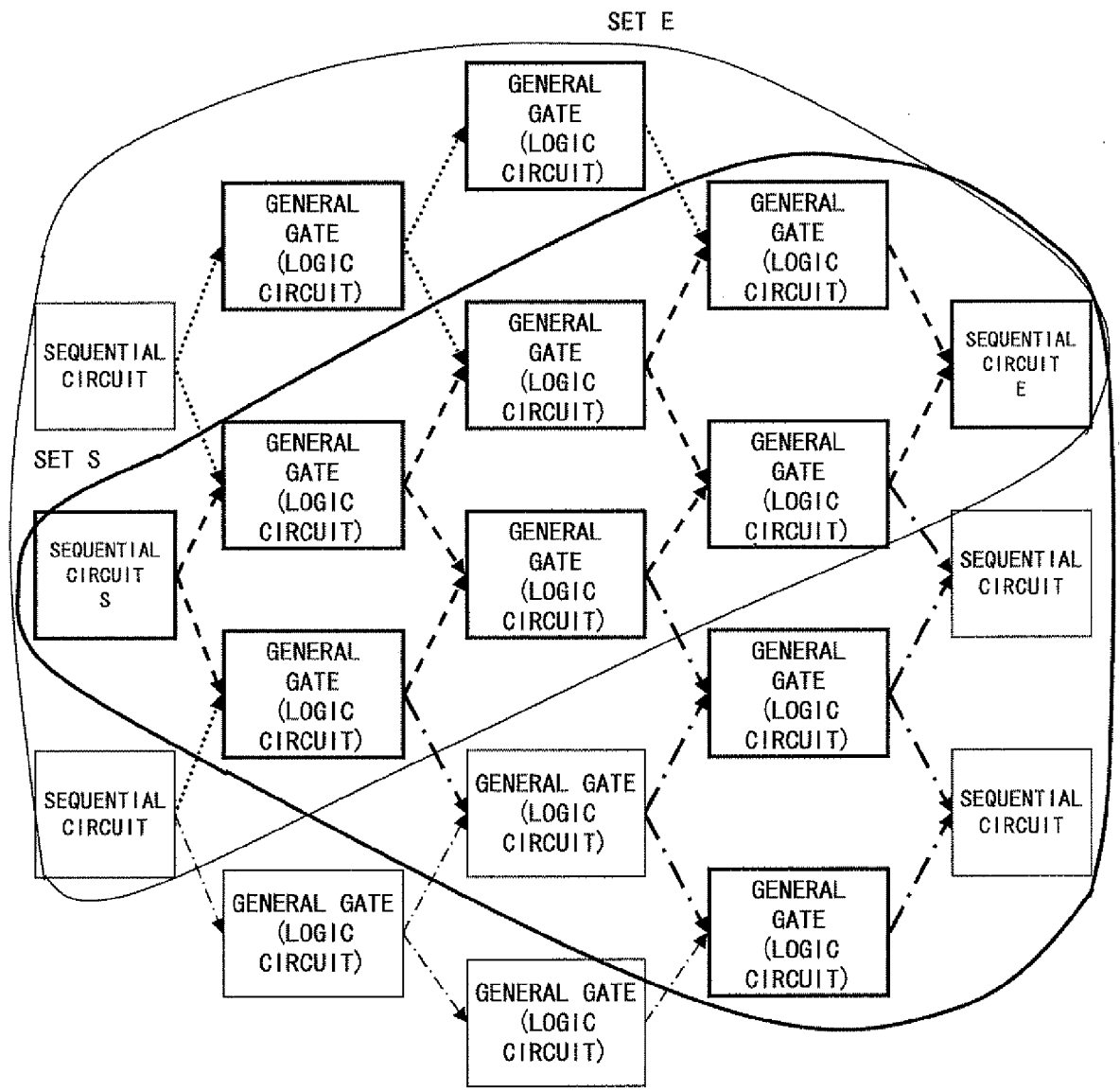
F I G. 6

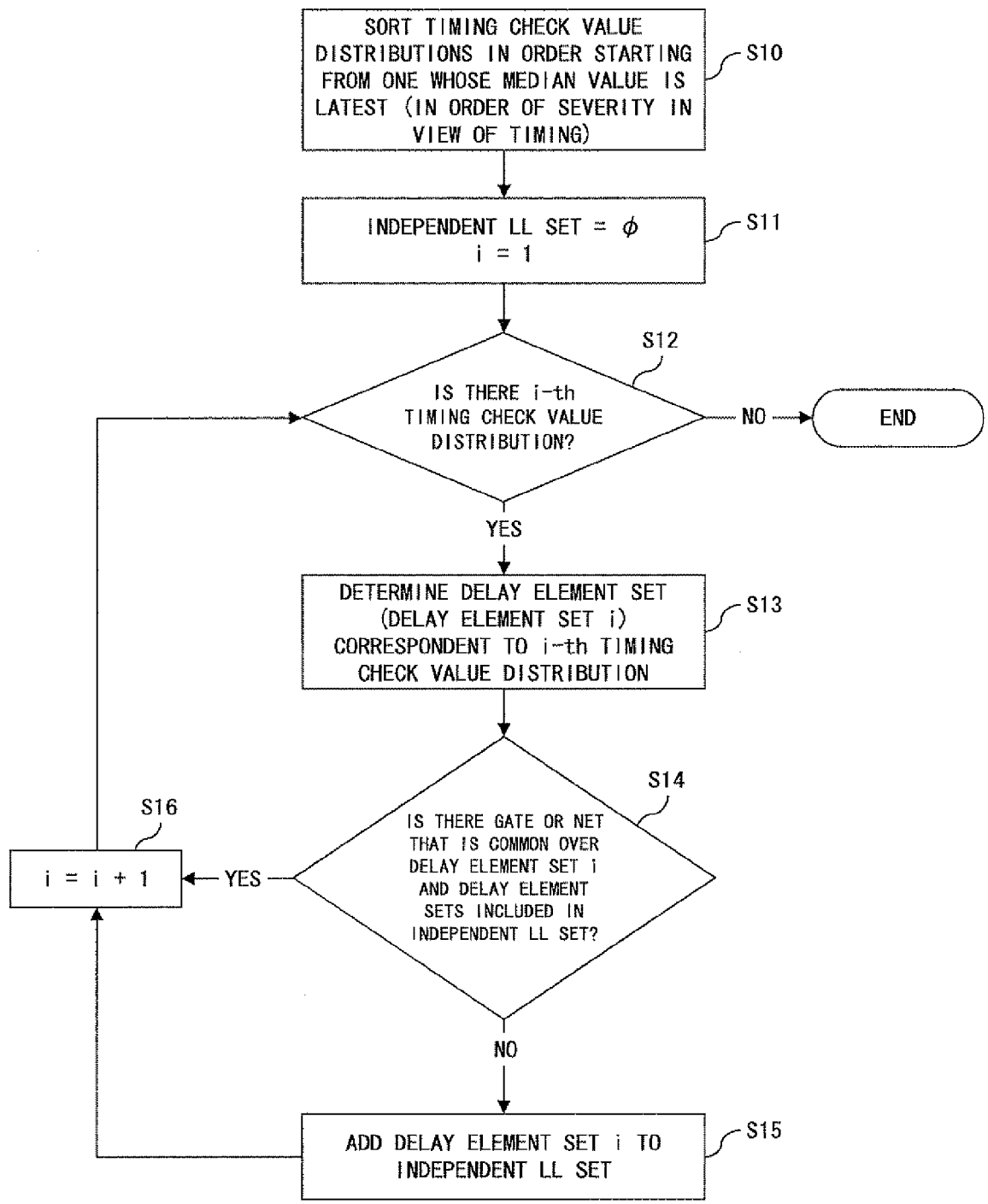
F I G. 7

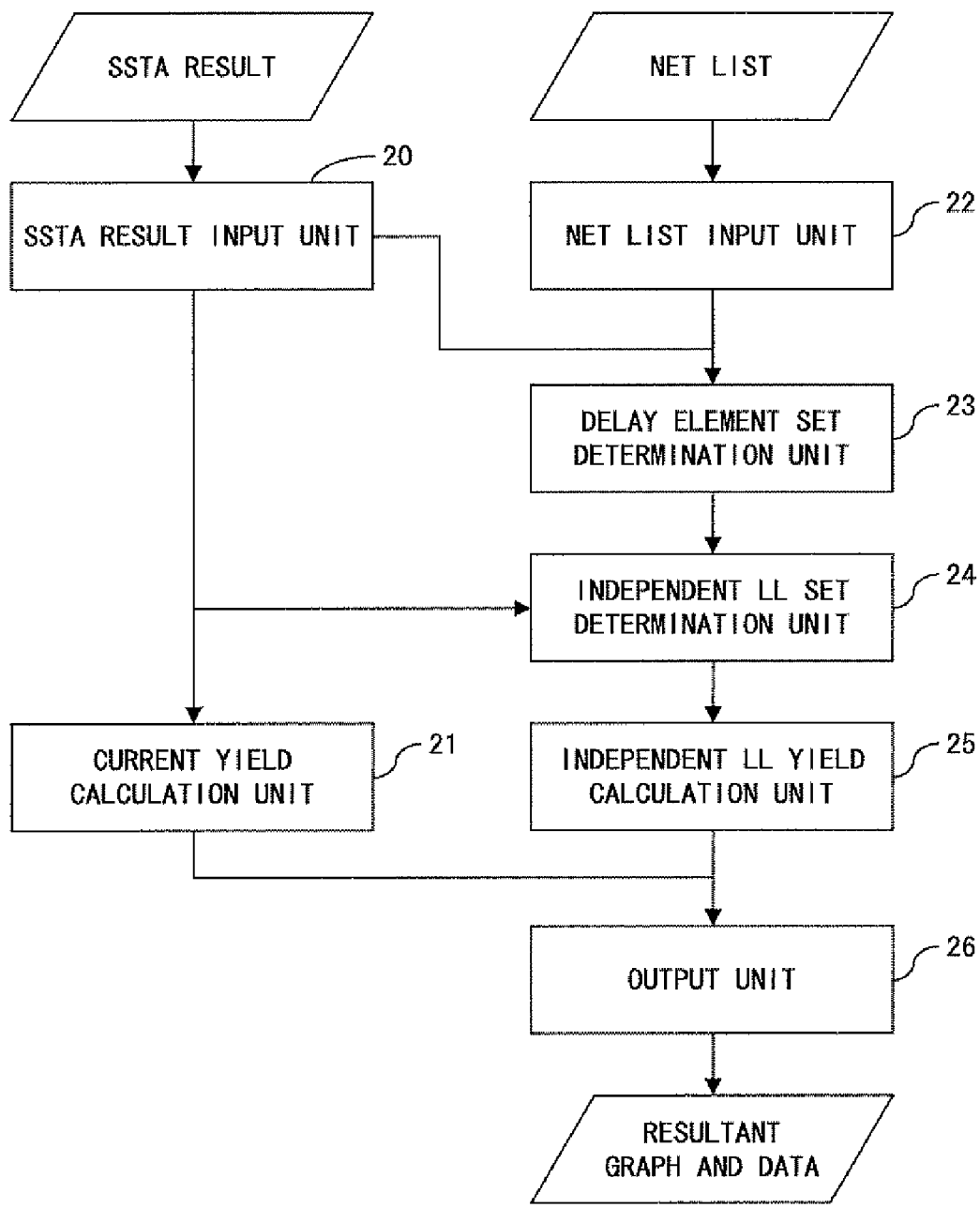
F I G. 8

METHOD OF EVALUATING PESSIMISTIC ERROR IN STATISTICAL STATIC TIMING ANALYSIS

CROSS-REFERENCE TO THE RELATED APPLICATIONS

This application is based upon and claims a benefit of priority of prior Japanese Patent Application No. 2006-185515, filed on Jul. 5, 2006, the entire contents of which are incorporated herein by reference.

BACKGROUND OF THE INVENTION

1. Field of the Invention

The present invention relates to a method of estimating a range of pessimistic errors in prediction calculations of yields of the production of LSIs by using statistical static timing analysis (SSTA).

2. Description of the Related Art

Generally in SSTA, timing is checked in units of paths that include all the gates and nets on all the paths connecting one sequential circuit with another, the sequential circuits themselves serving as the source and sink points, and distributions of the check values are calculated. A formula used for the timing check includes delay distributions between sequential circuits of source points and sink points, and delay distributions of clock paths that provide clock signals to the sequential circuits of the source points and the sink points. This means that the timing delay distribution on one path is calculated by using timing delay distributions that are input as timing distributions of respective sequential circuits.

It is assumed that when a timing check with a sequential circuit i which operates as the source point and a sequential circuit j which operates as the sink point is considered, the distribution of the check values is referred to as check value distribution ij, and a set of all the nets and gates on the LSIs related to the delay distributions between the sequential circuits of the source points and the sink points included in the timing check formula used for obtaining the check value distribution ij is referred to as a delay element set ij. This means that the delay element set ij includes all the nets and gates on at least one of the paths connecting the sequential circuits i and j.

When predicted values of yields of the production of LSIs are calculated, the check value distributions of all the LSIs are calculated, and a statistical max calculation is performed on the calculated check value distributions. The statistical max calculation is a multiplication of cumulative distributions. When the statistical max calculation is explained by using the example of two cumulative distribution functions (CDFs) C1 and C2, the result of the statistical max calculation on C1 and C2 can be expressed by the formula below.

$C(t)=C1(t) \times C2(t)$ ($t$ is a variable)

FIG. 1 shows an example of a result of the statistical max calculation on the cumulative distribution functions.

In FIG. 1, the result of the statistical max calculation on the cumulative distribution function C1 and the cumulative distribution function C2 is shown as the line denoted by the cumulative distribution function C1×C2. The cumulative distribution function C1×C2 presents a lower yield than the cumulative distribution function C1 or C2, which indicates that when the statistical max calculation is performed on the cumulative distribution functions, the resultant cumulative distribution function presents a yield value lower than that of the distribution before the statistical max calculation.

In the prediction calculations of yields of the production of LSIs, cumulative distribution functions are calculated on check value distributions of all the paths, and the statistical max calculations are performed on them. Then, one distribution is obtained for one LSI. The value of the point corresponding to the target (spec) frequency of the LSI on the distribution is dealt with as the yield at that target frequency.

Generally, a net or a gate can be one of the elements in a delay element set. In other words, one gate can be a gate on a path starting from a sequential circuit i to a sequential circuit j, and also a gate on a path starting from a sequential circuit l to a sequential circuit m.

The delaying behavior of one and the same gate or net on one LSI (delay values, delay value distributions) is determined by temperature, voltage, and production conditions; accordingly, when the timing check value distribution ij of the delay element set ij including a gate or a net and the timing check value distribution lm of another delay element set lm including the gate or the net are calculated, that gate or net experiences the same delaying/physical behavior. Accordingly, the prediction calculation of yields is desired to reflect this condition. Note that the function obtained by integrating the timing check value distribution is the cumulative distribution function.

However, in the conventional and commonly employed SSTA, it is difficult to subordinately deal with delay distributions of the gates and nets included in a plurality of delay element sets such as those described above in calculations, and actually the delay distributions of the nets and gates are independently dealt with as methods that can be used for designing LSIs (in other words, the process is executed in which one gate is assumed to belong to the delay element set ij in a calculation of a timing check value distribution, also the same gate is assumed to belong to the delay element set lm in a calculation of another timing check value distribution, and these timing check value distributions are separately calculated; thereafter the cumulative distribution functions are obtained by performing the statistical max calculation, which is a method that allows phenomena that cannot actually occur). Accordingly, it is known that the yield finally calculated out by using the SSTA involves errors in the pessimistic direction (in the direction in which the yields are reduced) more than the yield calculated in a manner such that the common parts over gates and nets are subordinately dealt with in accordance with the actual physical properties in calculation. In other words, in the commonly employed SSTA, when the timing check value distributions of the common delay elements over two paths in an LSI are obtained, the elements are dealt with as separate elements, and the prediction calculation of the yield of one LSI is performed by performing the statistical max calculations on cumulative distribution functions on the basis of the timing check value distributions that have been respectively obtained. As is explained in the above descriptions, in the statistical max calculation, the more cumulative distribution functions to be calculated there are, the lower the prediction of the yield tends to be. However, when performing the statistical max calculation on the cumulative distribution functions that have been separately obtained on the assumption that the same element belongs to different paths (delay element sets), the result is obtained in which the delay characteristic of the element is duplicately taken into consideration. In this SSTA, a predicted value that is more pessimistic than the actual yield is obtained.

In order to perform the accurate prediction of yields, it is necessary to avoid the above calculations, which means that the prediction calculations of yields have to be performed by using the Monte Carlo method. However, the Monte Carlo method requires a very large number of sample points, and commonly and currently available computers cannot calculate out results, within the limit of realistic time spans and calculation amounts, of the prediction calculations of yields of LSIs that include many delay elements.

The systems that perform the conventional timing analysis and the like are disclosed in Patent Documents 1 and 2.

Patent Document 1

Japanese Patent Application Publication No. 7-13974

Patent Document 2

Japanese Patent Application Publication No. 2005-92885

In view of the above problems, realization of accurate prediction calculations of yields of LSIs using statistical static timing analysis is desired.

SUMMARY OF THE INVENTION

It is an object of the present invention to provide a method that uses statistical static timing analysis by which an upper limit of errors in the pessimistic direction in prediction calculation results of yields of LSIs can be obtained, or the range of the predicted value of yields of LSIs (the actual yields of LSIs) when there is no calculation error can be determined.

The method according to the present invention is an evaluation method for calculating the yield of LSIs including a set of delay element sets in which sequence circuits are connected through delay elements such as gates, nets, and the like, comprising:

calculating a predicted distribution of a yield of an LSI by using all the delay element sets;

extracting from the plurality of delay element sets an independent delay element set that is delay element sets that do not have a gate or net in common thereamong;

performing a calculation of a predicted distribution of a yield by using only the independent delay element set; and outputting the predicted distribution of a yield obtained by using all the delay element sets, and the predicted distribution of a yield obtained by using only the independent delay element set.

According to the present invention, the range including actual yields of LSIs can be determined. It is also possible to obtain an upper limit of pessimistic errors of the yields obtained through the current SSTA.

BRIEF DESCRIPTION OF THE DRAWINGS

FIG. 2 shows a flowchart of the enter flow of the embodiment of the present invention;

FIG. 5 explains the independent LL yield;

FIG. 6 explains a method of determining the delay element set;

FIG. 7 shows a flowchart of the flow of processes of determining the independent LL set in the embodiment of the present invention; and FIG. 8 is a block diagram of a device that executes the processes in the embodiment of the present invention.

DESCRIPTION OF THE PREFERRED EMBODIMENTS

Figure 1:
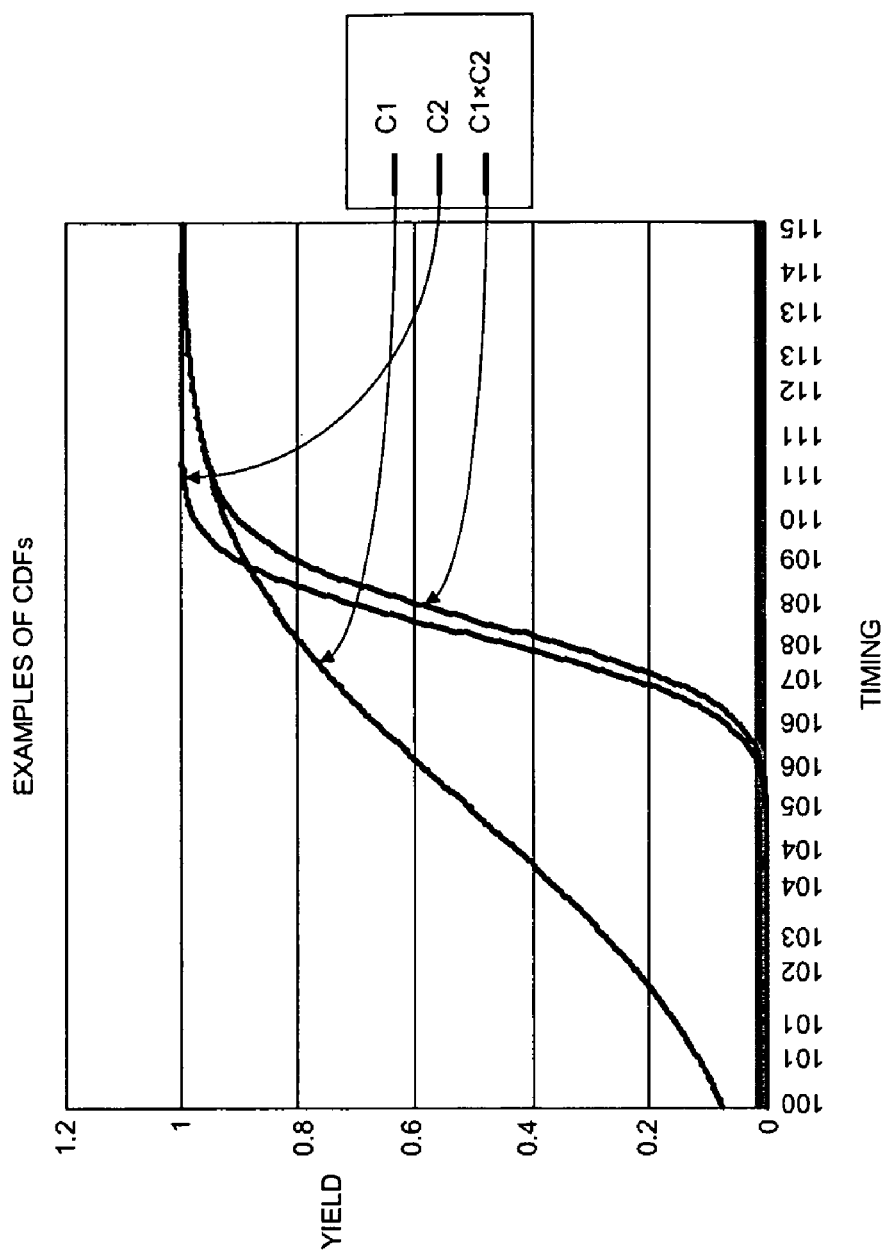
FIG. 1 shows an example of a result of the statistical max calculation on cumulative distribution functions.

In the embodiment according to the present invention, the range including the actual yield of LSIs is obtained by following the procedures listed below.

1. The yield of LSIs is obtained by using the conventional method of the SSTA (the yield thereby obtained is referred to as a current yield).
2. The set including delay element sets over which there is no common element (gate or net) is obtained among all the delay element sets (this set is referred to as an independent LL (Latch to Latch) set).
3. The LSIs made only of the delay element sets included in the independent LL set are assumed and the yield of the LSIs are calculated by using the conventional method of the SSTA (the yield thereby obtained is referred to as an independent LL yield).

When the yield that is obtained as the result of the calculation (which is actually difficult to obtain), in which the gates and nets that are common over a plurality of delay element sets are taken into consideration is referred to as an actual yield, the relationship between the independent LL yield obtained from the independent LL set having no common parts, the actual yield, and the current yield satisfies the inequality below.

Current yield ≦ Actual yield ≦ Independent LL yield

As described in the "Related Art" section, the current yield is smaller than the actual yield. In contrast, the independent LL yield is obtained by assuming that the LSIs include only the delay element sets in which the delay element sets (paths) including the delay elements (gates, nets and the like) that are common over a plurality of the delay element sets are removed from among the delay elements included in the LSIs, and thereafter the conventional SSTA is applied. In other words, the cumulative distribution functions are obtained for a number of paths that is smaller than the number of paths that have to be taken into consideration inherently, and the statistical max calculation is performed. As described above, in the statistical max calculation, the more cumulative distribution functions to be calculated there are, the worse the value tends to be. Accordingly, the independent LL yield obtained by performing the statistical max calculation only with the cumulative distribution functions of the paths in a smaller number than the actual LSIs expresses a value that is better than the actual yield. This is the reason why the above inequality is satisfied.

This indicates that the actual yield always has a value that is between the independent LL yield and the current yield, and by obtaining the independent LL yield in addition to the current yield on the basis of the current SSTA, the range including the actual yields can be determined. It is also possible to obtain an upper limit of the pessimistic errors of the yields obtained through the current SSTA.

FIG. 2 shows a flowchart of the entire flow of the embodiment of the present invention.

In step S1, the conventional SSTA is performed in order to obtain the current yield. In step S2, the independent LL set is selected from among the delay element sets. In step S3, the independent LL yield is obtained only on the selected independent LL set by using the conventional SSTA. In step S4, the upper limit of the pessimistic errors or the range of the actual yields is determined by using the above inequality.

Figure 3:
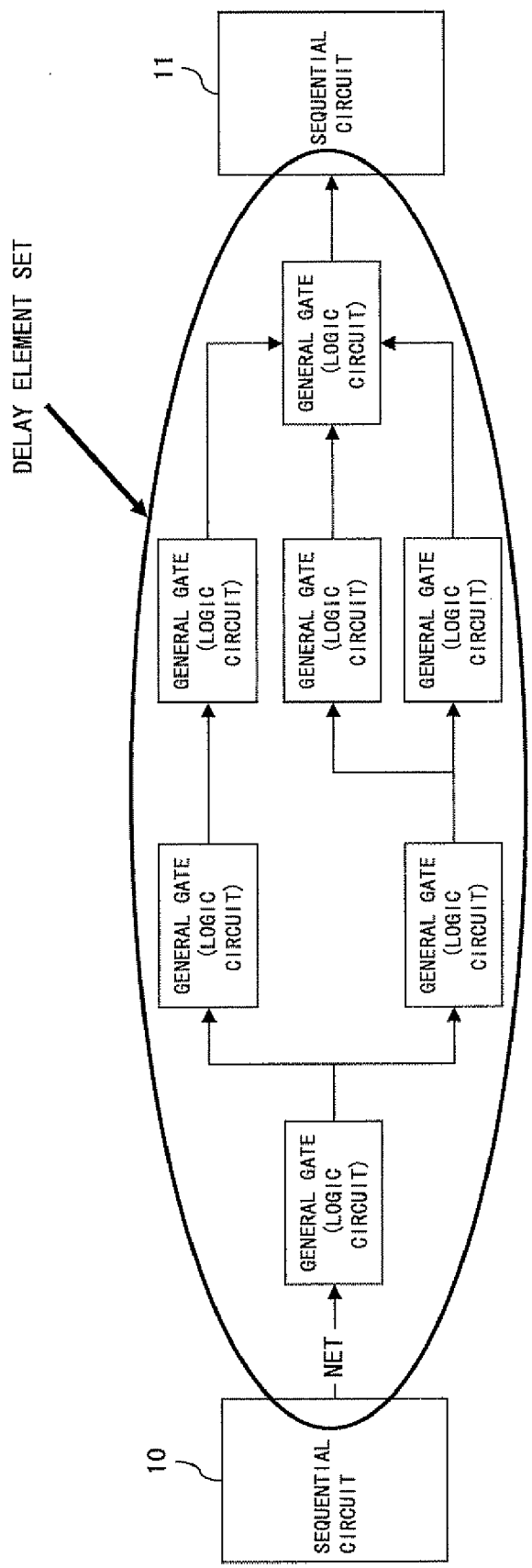
FIG. 3 explains a delay element set.

FIG. 3 explains the delay element set.

An LSI is a device configured in such a manner that a large number of sequential circuits 10 that are source points of the signals, sequential circuits 11 that are sink points of the signals, and signal paths consisting of nets that are wires for propagating the signals and general gates (logic circuits) that are connected to one another through the nets are combined in a complex manner. The timing at which a signal reaches the sequential circuit 11 from the sequential circuit 10 is determined by the accumulation of the propagation delays of the nets and the operation delays of the logic circuits. Each of the nets and logic circuits gives a delay to the signals, and thus they are called delay elements. Accordingly, the signal paths from the sequential circuit 10 to the sequential circuit 11 can be referred to as a set having delay elements as its elements. Therefore, when these signal paths are referred to as a set having delay elements, it is possible to deal with an LSI as a set including sets of delay elements.

Figure 4:
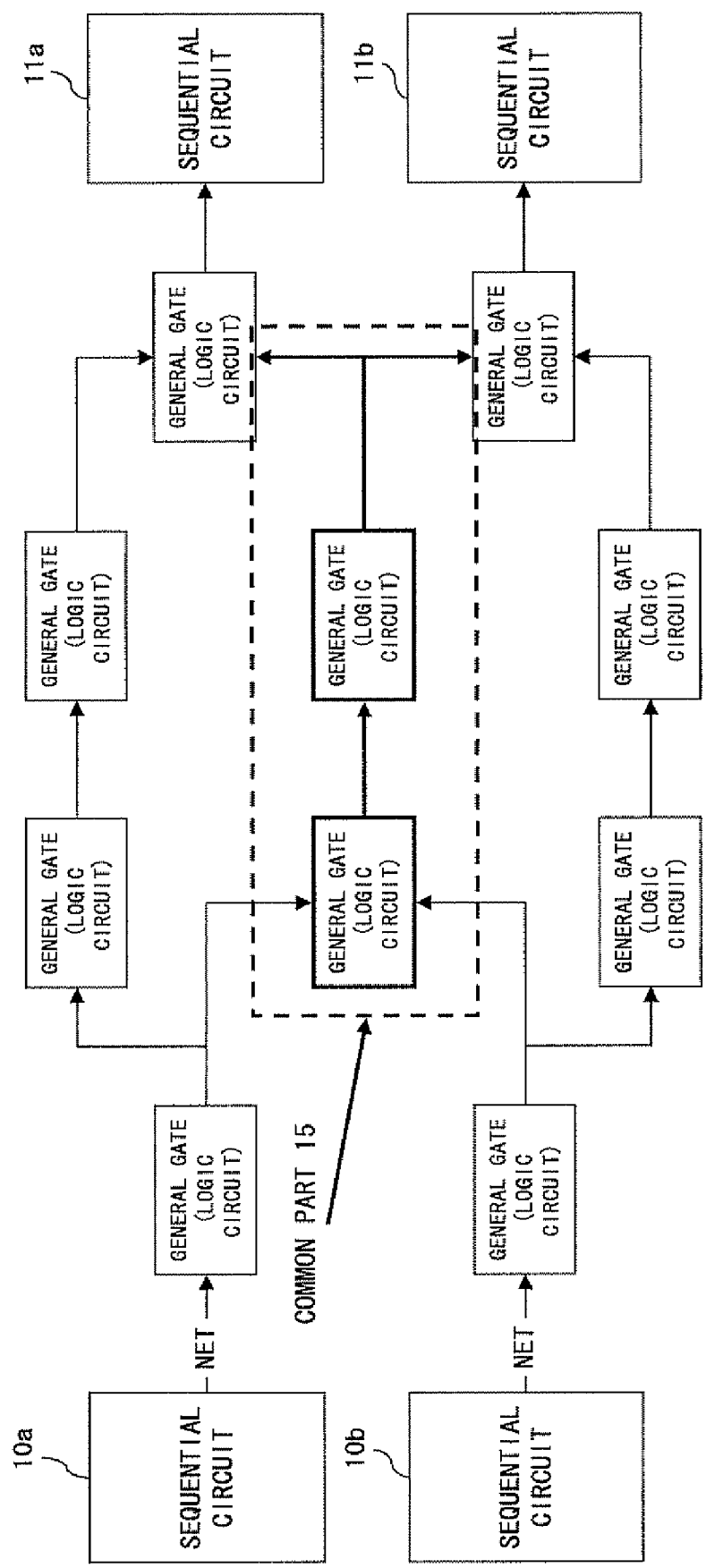
FIG. 4 explains gates and nets that are common over a plurality of the delay element sets.

FIG. 4 explains the gates and nets that are common over a plurality of the delay element sets.

FIG. 4 shows the case in which a delay element set from a sequential circuit 10a to a sequential circuit 11a and a delay element set from a sequential circuit 10b to a sequential circuit 11b are connected to each other, and a common part 15 included in both delay element sets has occurred. When the current yield is obtained by using the SSTA, the calculations are performed assuming that the common part 15 is independently included in both of the two sets, i.e., the delay element set from the sequential circuit 10a to the sequential circuit 11a, and the delay element set from the sequential circuit 10b to the sequential circuit 11b. When the independent LL yield is obtained, it is assumed that the common part 15 is included only in one of the two sets, i.e., the delay element set from the sequential circuit 10a to the sequential circuit 11a, and the delay element set from the sequential circuit 10b to the sequential circuit 11b, and only one of the delay element sets is used for the calculation, while the other delay element set is removed from the independent LL set and is not used for the calculation.

FIG. 5 explains the independent LL yield.

In FIG. 5, the independent LL yield and the current yield are expressed where the horizontal axis represents the 1/frequency (timing) and the vertical axis represents the yield. The respective yield values are expressed by the cumulative distribution functions, and are obtained by integrating the corresponding check value distributions. The current yield is the yield obtained through the SSTA by using the set having all the delay element sets included in the LSI. The line of the current yield presents the worst value among the three when observed at the same timing. The independent LL yield obtained through the SSTA by using only the sets of the independent LL sets which are subsets of the set having all the delay element sets, presents the best yield value among the three when observed at the same timing. And as described above, the actual yield is between the current yield and the independent LL yield. The difference between the independent LL yield and the current yield is the upper limit of the pessimistic error amount of yield. Although the actual yield between the current yield and the independent LL yield has the same slope as those of the independent LL yield and the current yield in FIG. 5, the line of the actual yield does not have to have that slope, but can have various slopes. In the embodiment of the present invention, it is only the fact that the actual yield is between the independent LL yield and the current yield.

FIG. 6 shows the method of determining the delay element set.

In the configuration consisting of the gates and nets as shown in FIG. 6, the set of gates and nets (set S) that propagate signals from a sequential circuit S is determined by processing forward from the sequential circuit S in the direction of the signal propagation on a net list. When the process reaches another sequential circuit, the trace on the net list is stopped. The set thereby obtained is the set S. Next, the set of gates and nets (set E) that propagate signals to a sequential circuit E is determined by processing backward from the sequential circuit E in the opposite direction to the signal propagation direction on the net list. When the process reaches another sequential circuit, the trace is stopped. The set thereby obtained is the set E. And the gates and nets that are common over the sets S and E are dealt with as the delay element sets covering from the sequential circuit S to the sequential circuit E. In other words, the set consisting of the general gates (logic circuits) connected by the slashed arrows and the nets corresponding to the slashed arrows is the delay element set from the sequential circuit S to the sequential circuit E. The set having the delay element sets is created by performing the above procedures on all the sequential circuits, gates and nets in the LSI.

The outline of the embodiment of the present invention is as follows. The current yield is calculated by using the conventional SSTA. The timing check distributions in the LSI obtained as a result of the SSTA are arranged in the order starting from the distribution that has the greatest influence on the LSI yield (in the order, for example, starting from the distribution whose frequency at its median value is the smallest). The sets (delay element sets) of the gates and nets on all the paths connecting the sequential circuits at both ends of the net list of the LSI are determined in the order of the arranged distributions. In a case in which one delay element set is determined and none of the gates and nets in the set are elements of any of the delay element sets already included in the independent LL set, the delay element sets are added to the independent LL set. It is repeatedly determined, for each time one delay element set is determined, whether or not the delay element set can be added to the independent LL set as described above, and thereby the final independent LL set is determined. The timing check value distributions corresponding to the delay element sets included in the independent LL set that is determined are finally collected, the statistical max calculation is performed, and the independent LL yield is calculated out. The difference between this independent LL yield and the current yield is the upper limit of the pessimistic error of the current yield. Data and graphs of the independent yield and the current yield are displayed on a screen, and thereby users can understand the amount of the pessimistic error of the current yield and the range of the actual yield.

FIG. 7 shows a flowchart of the flow of processes of determining the independent LL set in the embodiment of the present invention.

Explanations are given by referring to FIG. 7. In step S10, the timing check value distributions are sorted in the order starting from the distribution whose frequency at its median value is the latest (in the order of severity in view of timing). In step S11, the independent LL set is set to an empty set, and an index i of the timing check value distributions sorted in step S10 is set to 1 as initialization. In step S12, it is determined whether or not there is the i-th timing check value distribution. When the result in the step S12 is NO, the process is terminated. When the result of the step S12 is YES, the delay element set (delay element set i) corresponding to the i-th timing check value distribution is determined in step S13. In step S14, it is determined whether or not there is a gate or net that is common over the delay element set i and the delay element sets included in the independent LL set. In other words, the delay element set i having the gates and nets that are common with the delay element sets that were categorized into the independent LL set is removed, and the delay element set i not having the common gate or net is newly categorized into the independent LL set. When the result in step S14 is YES, the delay element set i cannot be the independent LL set; accordingly, i is incremented by 1 in step S16, the process returns to step S12, and the same processes are executed on other delay element sets. When the result in step S14 is YES, the delay element i does not include the gate or net common with the independent LL set; accordingly, the delay element i is added to the independent LL set in step S15, i is incremented by 1 in step S16, the process returns to step S12, and processes are executed on other delay element sets. Thereby, the set of the independent LL sets is created.

FIG. 8 is a block diagram of a device that executes the processes in the embodiment of the present invention.

Results of calculations obtained by using the conventional SSTA are input into an SSTA result input unit 20, and a net list is input into a net list input unit 22. The SSTA results and the net list are input into a delay element set determination unit 23, and the set of the delay element sets are created. Also, the set of the delay element sets and the SSTA results are input into an independent LL set determination unit 24, and the independent LL set is determined. A current yield calculation unit 21 performs the statistical max calculation on the SSTA results in order to obtain the current yield. An independent LL yield calculation unit 25 calculates the independent LL yield. In an output unit 26, the graph of the current yield and the graph of the independent LL yield are created, and are output as the result graphs. It is also possible to output various values that can be read from the graphs as the result data, in addition to the result graphs.

What is claimed is:

1. An evaluation method for calculating a yield of LSIs including sets including delay element sets, wherein within the delay element sets sequential circuits are connected through delay elements including gates, and nets, the method comprising:
    calculating, with a computer, a first predicted distribution of a yield of an LSI by using all the delay element sets;
    extracting, with the computer, from the plurality of the delay element sets an independent delay element set that is a subset of the delay element sets that do not have a gate or net in common with another delay element set, the extracting includes extracting using a net list which is supplied before start of the evaluation method;
    calculating, with the computer, a second predicted distribution of a yield by using only the independent delay element set;
    outputting the first predicted distribution and the second predicted distribution; and
    deriving an actual yield of the LSI is from a difference between the predicted distribution of a yield obtained by using all the delay element sets and the predicted distribution of a yield obtained by using only the independent delay element set.

2. The evaluation method according to claim 1, wherein:
    calculating the first predicted distribution of a yield is includes employing the statistical static timing analysis.

3. The evaluation method according to claim 1, wherein:
    the independent delay element set is formed by:
        extracting one of the delay element sets;
        determining whether or not one of the delay elements included in the extracted one of the delay element sets is a member of a group of delay elements included in the independent delay element set; and
        categorizing the one of the delay element sets into the independent delay element set when it is determined that the delay element included in the extracted one of the delay element sets is not a member of the group of delay elements included in the independent delay element set.

4. The evaluation method according to claim 3, further comprising:
    deriving an actual yield of the LSI is from a difference between the predicted distribution of a yield obtained by using all the delay element sets and the predicted distribution of a yield obtained by using only the independent delay element set.

5. The evaluation method according to claim 4, wherein calculating the first predicted distribution and calculating the second predicted distribution both use a same method.

6. The evaluation method according to claim 1, wherein:
    the independent delay element set is formed by:
        extracting one of the delay element sets;
        determining whether or not one of the delay elements included in the extracted one of the delay element sets is a member of a group of delay elements included in the independent delay element set; and
        categorizing the one of the delay element sets into the independent delay element set when it is determined that the delay element included in the extracted one of the delay element sets is not a member of the group of delay elements included in the independent delay element set.

7. The evaluation method according to claim 1, wherein, an actual yield is intermediate the first predicted distribution and the second predicted distribution.

8. The evaluation method according to claim 1, wherein, calculating the first predicted distribution and calculating the second predicted distribution both use a same method.

9. An evaluation device for calculating a yield of LSIs including sets having delay element sets, wherein within the delay element sets sequential circuits are connected through delay elements including gates, and nets, comprising:
    a current yield calculation unit to calculate a first predicted distribution of a yield of an LSI by using all the delay element sets;
    an independent delay element set extraction unit to extract from the plurality of the delay element sets an independent delay element set that is a subset of the delay element sets that do not have a gate or net in common with another delay element set;
    an independent delay element set yield calculation unit to calculate a second predicted distribution of a yield by using only the independent delay element set; and
    an output unit to output the first predicted distribution and the second predicted distribution; and
    a derivation unit to derive an actual yield of the LSI is from a difference between the predicted distribution of a yield obtained by using all the delay element sets and the predicted distribution of a yield obtained by using only the independent delay element set, wherein
    the independent delay element set extraction unit extracts using a net list which is supplied before start of the evaluation method.

10. A computer readable medium storing a program, which when executed by a computer, causes the computer to perform an evaluation method for calculating a yield of LSIs including sets having delay element sets, wherein within the delay element sets sequential circuits are connected through delay elements including gates, and nets, the method comprising:

calculating a first predicted distribution of a yield of an LSI by using all the delay element sets;

extracting from the plurality of the delay element sets an independent delay element set that is a subset of the delay element sets that do not have a gate or net in common with another delay element set, the extracting includes using a net list which is supplied before start of the evaluation method;

calculating a second predicted distribution of a yield by using only the independent delay element set; and outputting the first predicted distribution and the second predicted distribution; and deriving an actual yield of the LSI is from a difference between the predicted distribution of a yield obtained by using all the delay element sets and the predicted distribution of a yield obtained by using only the independent delay element set.

11. A yield calculation method for calculating an actual yield of circuit elements having delay element sets, wherein within the delay element sets sequential circuits are connected through delay elements, the method comprising:

calculating, with a computer, a first yield of the circuit elements by using all the delay element sets relating to the circuit elements;

extracting, with the computer, from the delay element sets an independent delay element set that is a subset of the delay element sets and do not have a delay element in common with another delay element set, the extracting includes extracting using a net list which is supplied before start of the yield calculation method;

calculating, with the computer, a second yield of the circuit elements by using only the independent delay element set; and predicting, with the computer, the actual yield of the circuit elements by comparing the first yield with the second yield.

12. The yield calculation method according to claim 11, wherein:

the predicting is performed based on an assumption that a value between the first yield and the second yield is the actual yield, with the first yield being a lower limit and the second yield being an upper limit.

\* \* \* \* \*